United States Patent
Ikari

(10) Patent No.: US 10,526,725 B2
(45) Date of Patent: Jan. 7, 2020

(54) MAGNETOOPTICAL MATERIAL, MANUFACTURING METHOD THEREFOR, AND MAGNETOOPTICAL DEVICE

(71) Applicant: Shin-Etsu Chemical Co., Ltd., Tokyo (JP)

(72) Inventor: Masanori Ikari, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 14/917,149

(22) PCT Filed: Sep. 11, 2014

(86) PCT No.: PCT/JP2014/074040
§ 371 (c)(1),
(2) Date: Mar. 7, 2016

(87) PCT Pub. No.: WO2015/037649
PCT Pub. Date: Mar. 19, 2015

(65) Prior Publication Data
US 2016/0201222 A1    Jul. 14, 2016

(30) Foreign Application Priority Data
Sep. 12, 2013 (JP) ................. 2013-189348

(51) Int. Cl.
C30B 29/22 (2006.01)
G02F 1/00 (2006.01)
(Continued)

(52) U.S. Cl.
CPC .............. *C30B 29/22* (2013.01); *C04B 35/01* (2013.01); *C04B 35/16* (2013.01); *C04B 35/457* (2013.01);
(Continued)

(58) Field of Classification Search
CPC ........... C30B 29/22; C30B 1/12; C30B 29/32; C30B 29/30; G01F 1/0036; G01F 1/093;
(Continued)

(56) References Cited

U.S. PATENT DOCUMENTS

| 6,208,795 B1 | 3/2001 | Nakano et al. |
| 8,343,884 B2 | 1/2013 | Menke et al. |

(Continued)

FOREIGN PATENT DOCUMENTS

| CN | 101041458 A | * | 9/2007 |
| CN | 103113106 A | | 5/2013 |

(Continued)

OTHER PUBLICATIONS

Gardner, "Single crystal growth by flaoting-zone method of a geometricall frustrated pyrochlore antiferromagnet, Tb2Ti2O7", 1998, Journal of Crystal Growth, 191, 740-745.*

(Continued)

*Primary Examiner* — James A Fiorito
(74) *Attorney, Agent, or Firm* — Westerman, Hattori, Daniels & Adrian, LLP

(57) ABSTRACT

This invention provides a transparent magnetooptical material that is suitable for use in a magnetooptical device such as an optical isolator. Said magnetooptical material comprises either a transparent ceramic consisting primarily of a complex oxide that can be represented by formula (1) or a single crystal of such a complex oxide. Said magnetooptical material does not absorb fiber-laser light in the 0.9-1.1 μm wavelength range, does not cause heat lensing, and has a higher Verdet constant than TGG crystals, with a Verdet constant of at least 0.14 min/(Oe·cm) at a wavelength of 1,064 nm.

$$Tb_2R_2O_7 \qquad (1)$$

(Continued)

(In formula (1), R represents one or more elements selected from among the group consisting of silicon, germanium, titanium, tantalum, tin, hafnium, and zirconium (but not silicon only, germanium only, or tantalum only)).

12 Claims, 2 Drawing Sheets

(51) Int. Cl.

| | | |
|---|---|---|
| C30B 29/32 | (2006.01) | |
| G02F 1/09 | (2006.01) | |
| C30B 1/12 | (2006.01) | |
| C30B 29/30 | (2006.01) | |
| C04B 35/01 | (2006.01) | |
| C04B 35/16 | (2006.01) | |
| C04B 35/457 | (2006.01) | |
| C04B 35/462 | (2006.01) | |
| C04B 35/486 | (2006.01) | |
| C04B 35/495 | (2006.01) | |
| C04B 35/626 | (2006.01) | |
| C04B 35/645 | (2006.01) | |

(52) U.S. Cl.
CPC .......... *C04B 35/462* (2013.01); *C04B 35/486* (2013.01); *C04B 35/495* (2013.01); *C04B 35/6261* (2013.01); *C04B 35/6455* (2013.01); *C30B 1/12* (2013.01); *C30B 29/30* (2013.01); *C30B 29/32* (2013.01); *G02F 1/0036* (2013.01); *G02F 1/09* (2013.01); *G02F 1/093* (2013.01); *C04B 2235/3218* (2013.01); *C04B 2235/3224* (2013.01); *C04B 2235/3244* (2013.01); *C04B 2235/3251* (2013.01); *C04B 2235/3287* (2013.01); *C04B 2235/3293* (2013.01); *C04B 2235/3418* (2013.01); *C04B 2235/5436* (2013.01); *C04B 2235/6567* (2013.01); *C04B 2235/661* (2013.01); *C04B 2235/762* (2013.01); *C04B 2235/77* (2013.01); *C04B 2235/786* (2013.01); *C04B 2235/80* (2013.01); *C04B 2235/81* (2013.01); *C04B 2235/9646* (2013.01); *C04B 2235/9653* (2013.01)

(58) Field of Classification Search
CPC .......... G01F 1/09; C04B 35/01; C04B 35/16; C04B 35/457; C04B 35/462; C04B 35/486; C04B 35/495; C04B 35/6261; C04B 35/6455

See application file for complete search history.

(56) References Cited

U.S. PATENT DOCUMENTS

| 8,753,538 | B2 | 6/2014 | Makikawa et al. |
|---|---|---|---|
| 2012/0236409 | A1 | 9/2012 | Yahagi et al. |
| 2013/0222909 | A1 | 8/2013 | Makikawa et al. |

FOREIGN PATENT DOCUMENTS

| DE | 10 2010 028 213 A1 | 10/2011 |
|---|---|---|
| DE | 102010021203 A1 | 11/2011 |
| EP | 2 500 763 A1 | 9/2012 |
| JP | 2000-266947 A | 9/2000 |
| JP | 2002-293693 A | 10/2002 |
| JP | 2005-330133 A | 12/2005 |
| JP | 2009-143751 A | 7/2009 |
| JP | 2010-241677 A | 10/2010 |
| JP | 2010-285299 A | 12/2010 |
| JP | 2011-121837 A | 6/2011 |
| JP | 2011-213552 A | 10/2011 |
| JP | 2012-36031 A | 2/2012 |
| JP | 2012-82079 A | 4/2012 |
| JP | 2013-79195 A | 5/2013 |

OTHER PUBLICATIONS

Peng et. al., Hydrothermal Synthesis and Characterization of Pyrochlore Titanate R2TiO7 (R=Gd3+, Tb3+, Dy3+), Chem. Res. Chinese Universities, 2011, 27(2), 161-165.*
CN101041458A (Machine Translation).*
Blanchard et. al., Investigating the local structure of lanthanoid hatnates Ln2Hf2O7 via diffraction and spectroscopy, 2013, Physical Chemistry, 117, 2266-2273 (Year: 2013).*
Gardner, J.S. et al, "Single Crystal Growth by the Floating-Zone Method of a Geometrically Frustrated Pyrochlore Antiferromagnet, Tb2Ti2O7", Journal of Crystal Growth, Aug. 1, 1998, vol. 191, No. 4, pp. 740-745.
Extended European Search Report dated Mar. 14, 2017, issued in counterpart European Application No. 14844266.8. (9 pages).
Office Action dated Jun. 21, 2016, issued in counterpart Japanese Patent Application No. 2015-536616. (3 pages).
International Search Report dated Dec. 2, 2014, issued in counterpart Application No. PCT/JP2014/074040 (1 page).
Fleet et al., "Rare earth disilicates $R_2Si_2O_7$ (R = Gd, Tb, Dy, Ho): type B", Z Kristallogr, 2003, vol. 218, No. 12, pp. 795-801, cited in Specification (7 pages).
Ji et al., "Fabrication of transparent $La_2Hf_2O_7$ ceramics from combustion synthesized powders", Materials Research Bulletin, 2005, vol. 40, No. 3, pp. 553-559, cited in Specification (7 pages).
Takatsu et al., "Quantumu spin fluctuations in the spin liquid state of $Tb_2Ti_2O_7$", arXiv:1106.3649v3, Dec. 13, 2011, pp. 1-5, cited in ISR (5 pages).

* cited by examiner

MAGNETOOPTICAL MATERIAL, MANUFACTURING METHOD THEREFOR, AND MAGNETOOPTICAL DEVICE

TECHNICAL FIELD

This invention relates to magneto-optical materials and magneto-optical devices. More particularly, the invention relates to magneto-optical materials that are made of a complex oxide-containing transparent ceramic or single crystal and are suitable for constructing magneto-optical devices such as optical isolators, and to a method of manufacturing such materials. The invention also relates to magneto-optical devices that use such magneto-optical materials.

BACKGROUND ART

In recent years, partly on account of the higher power levels that have become possible, there has been a remarkable growth in the use of laser beam machines which employ fiber lasers. However, the resonance state of the laser light source within a laser beam machine is destabilized by the entry of outside light, disturbing the oscillation state. Disruption of the oscillation state is particularly severe when the light that has been generated is reflected by intermediate optics and returns to the light source. To keep this from happening, an optical isolator is generally provided just in front of the light source, for example.

Optical isolators are made of a Faraday rotator, a polarizer situated on the input side of the Faraday rotator, and an analyzer situated on the output side of the Faraday rotator. The Faraday rotator is used by applying a magnetic field parallel to the propagation direction of light, at which time a polarized component of light, whether traveling forward or backward through the Faraday rotator, rotates only in a fixed direction. In addition, the Faraday rotator is adjusted to a length such that the polarized component of light rotates exactly 45°. When the polarizer and analyzer planes of polarization are offset by 45° in the direction of rotation by forward-traveling light, polarized light traveling forward coincides with the polarizer position and with the analyzer position and thus passes through each. By contrast, polarized light traveling backward from the analyzer position rotates 45° in the opposite direction from the direction of angle offset by the polarizer plane of polarization that is offset 45°. As a result, the returning light has a plane of polarization at the polarizer position that is offset 45°−(−45°)=90° with respect to the polarizer plane of polarization, and thus cannot pass through the polarizer. Hence, the optical isolator functions by allowing forward-traveling light to pass through and exit therefrom and by blocking backward-traveling return light.

Materials hitherto know to be capable of use as the Faraday rotator in optical isolators include TGG crystals ($Tb_3Ga_5O_{12}$) and TSAG crystals ($Tb_{(3-x)}Sc_2Al_3O_{12}$) (JP-A 2011-213552 (Patent Document 1) and JP-A 2002-293693 (Patent Document 2)). TGG crystals have a relatively large Verdet constant of 40 rad/(T·m), and today are widely used in standard fiber laser systems. TSAG crystals have a Verdet constant which is reportedly about 1.3 times that of TGG crystals and is likewise a material used in fiber laser systems.

In addition, JP-A 2010-285299 (Patent Document 3) discloses a single crystal or ceramic composed primarily of the oxide ($Tb_xR_{1-x})_2O_3$, wherein $0.4 \leq x \leq 1.0$ and R is selected from the group consisting of scandium, yttrium, lanthanum, europium, gadolinium, ytterbium, holmium and lutetium. Oxides composed of these constituents have a Verdet constant of 0.18 min/(Oe·cm) or more, with the largest Verdet constant mentioned in the examples provided therein being 0.33 min/(Oe·cm). The same document also mentions, in the text thereof, a Verdet constant for TGG of 0.13 min/(Oe·cm). Hence, the difference between the Verdet constants for both is 2.5-fold.

An oxide composed of substantially similar components is disclosed in JP-A 2011-121837 (Patent Document 4) as well, where it is mentioned that this oxide has a larger Verdet constant than a TGG single crystal.

When, as in Patent Documents 3 and 4 above, an optical isolator having a large Verdet constant is obtained, the total length required for 45° rotation can be shortened, which is desirable in that it makes a smaller optical isolator possible.

Although the ($Tb_xR_{1-x})_2O_3$ oxides disclosed in Patent Documents 3 and 4 do indeed have very large Verdet constants which are 1.4 to 2.5 times as large as those of the TGG crystals disclosed in Patent Document 1 and the TGG crystals mentioned in the text of Patent Document 3, these oxides end up slightly absorbing fiber laser light in the wavelength range of 0.9 to 1.1 μm where they are expected to be used. With fiber lasers in recent years becoming increasingly high-powered, even when a laser is equipped with an optical isolator having only slight absorption, this leads to deterioration in beam quality on account of a thermal lens effect.

One material that has a very large Verdet constant per unit length is iron (Fe)-containing yttrium iron garnet (YIG) single crystals (JP-A 2000-266947 (Patent Document 5)). However, iron has a large light absorption at a wavelength of 0.9 μm, which absorption affects optical isolators used in the wavelength range of 0.9 to 1.1 μm. This makes optical isolators that use such yttrium iron garnet single crystals very difficult to employ in fiber laser systems where the trend is clearly toward higher power levels.

Hence, there exists a desire for an entirely new material that has a larger Verdet constant than TGG crystals ($Tb_3Ga_5O_{12}$) and TSAG crystals ($Tb_{(3-x)}Sc_2Al_3O_{12}$), and that does not absorb fiber laser light in the wavelength range of 0.9 to 1.1 μm.

Candidates for such a material include oxides having a pyrochlore-type crystal structure. Pyrochlore-type crystals which have an $A_2B_2O_7$ crystal structure and for which the ratio between the radii of A ions and B ions falls within a fixed range are known to have a cubic structure. Being able to select a material having a crystal structure that is cubic would make it possible to produce a material which, not only as a single crystal, but even as a ceramic body, has a high transparency and thus could be employed as various types of optical materials.

JP-A 2005-330133 (Patent Document 6) discloses, as examples of such pyrochlore-type materials, cubic titanium oxide pyrochlore sintered bodies characterized in that they are formed by sintering an electron-conducting ceramic powder which is, of the cubic titanium oxide pyrochlores having a rare-earth element RE at the A sites, a complex oxide $RE_{2-x}Ti_2O_{7-\delta}$ wherein the element RE at the A sites is one, two or more of the elements lutetium, ytterbium, thulium, erbium, holmium, yttrium, scandium, dysprosium, terbium, gadolinium, europium, samarium and cerium, and which has a non-stoichiometric amount x of the A-site element RE set within the range $$0 < x < 0.5$$

according to the A-site element RE, and subsequently subjecting the sintered powder to reduction treatment. Because the intended application for this art is an electron-conducting ceramic, no mention is made of the transparency of this sintered body. It is known, among those skilled in the art, that normal sintering alone usually yields an opaque sintered body, and so the materials described in Patent Document 6 presumably cannot be used in optical material applications. However, the fact that terbium-containing titanium oxide pyrochlore can have a cubic crystal structure has been disclosed in this publication (Patent Document 6).

Yet, it was separately known before this that a cubic crystal structure is not possible in a simply terbium-doped silicon oxide (see "Rare earth disilicates $R_2Si_2O_7$(R=Gd, Tb, Dy, Ho): type B," Z., Kristallogr., Vol. 218, No. 12, 795-801 (2003) (Non-Patent Document 1)).

Also, the fact that certain rare earth-hafnium oxides, although containing no terbium whatsoever, assume a cubic pyrochlore structure and have translucency was disclosed at about the same time ("Fabrication of transparent $La_2Hf_2O_7$ ceramics from combustion synthesized powders," Mat. Res. Bull. 40(3), 553-559 (2005) (Non-Patent Document 2)).

In addition, JP-A 2010-241677 (Patent Document 7) discloses an optical ceramic which is a polycrystalline, transparent optical ceramic wherein at least 95 wt %, and preferably at least 98 wt %, of the individual crystals have a cubic pyrochlore or fluorite structure and which contains the stoichiometric compound $$A_{2+x}B_yD_zE_7$$

Here, when $-1.15 \leq x \leq 0$, $0 \leq y \leq 3$ and $0 \leq z \leq 1.6$, $3x+4y+5z=8$. Also, A is at least one trivalent cation selected from the group of rare-earth metal oxides, B is at least one tetravalent cation, D is at least one pentavalent cation, and E is at least one divalent anion. In this optical ceramic, A is selected from among yttrium, gadolinium, ytterbium, lutetium, scandium and lanthanum, and B is selected from among titanium, zirconium, hafnium, tin and germanium. This publication confirms that, in spite of containing no terbium whatsoever, titanium oxide, zirconium oxide, hafnium oxide, tin oxide and germanium oxide containing several types of rare earths can form an at least 98 wt % cubic pyrochlore structure.

PRIOR ART DOCUMENTS

Patent Documents

Patent Document 1: JP-A 2011-213552
Patent Document 2: JP-A 2002-293693
Patent Document 3: JP-A 2010-285299
Patent Document 4: JP-A 2011-121837
Patent Document 5: JP-A 2000-266947
Patent Document 6: JP-A 2005-330133
Patent Document 7: JP-A 2010-241677

Non-Patent Documents

Non-Patent Document 1: "Rare earth disilicates $R_2Si_2O_7$ (R=Gd, Tb, Dy, Ho): type B," Z., Kristallogr., Vol. 218, No. 12, 795-801 (2003)
Non-Patent Document 2: "Fabrication of transparent $La_2Hf_2O_7$ ceramics from combustion synthesized powders," Mat. Res. Bull. 40(3), 553-559 (2005)

SUMMARY OF THE INVENTION

Problems to be Solved by the Invention

This invention was arrived at in view of the above circumstances. The object of the invention is to provide transparent magneto-optical materials which do not absorb fiber laser light in the wavelength range of 0.9 to 1.1 μm and thus inhibit the generation of a thermal lens, have a larger Verdet constant than TGG crystals, and are suitable for constructing magneto-optical devices such as optical isolators. Further objects of the invention are to provide a method for producing such magneto-optical materials, and to provide magneto-optical devices using such materials.

Means for Solving the Problems

Based on the above findings in the prior art, the inventor has conducted investigations on various terbium-containing pyrochlore-type materials as entirely new material candidates which have larger Verdet constants than TGG crystals ($Tb_3Ga_5O_{12}$) and TSAG crystals ($Tb_{(3-x)}Sc_2Al_3O_{12}$) and do not absorb fiber laser light in the wavelength range of 0.9 to 1.1 μm, ultimately achieving both magneto-optical materials suitable for use in magneto-optical devices such as optical isolators and also magneto-optical devices constructed with such materials.

In order to attain the above objects, the invention provides the following magneto-optical material, method of production thereof, and magneto-optical device.

[1] A magneto-optical material characterized by comprising a transparent ceramic containing as a main component a complex oxide of formula (1) below, or comprising a single crystal of a complex oxide of formula (1) below $$Tb_2R_2O_7 \tag{1}$$

(wherein R is at least one element selected from the group consisting of silicon, germanium, titanium, tantalum, tin, hafnium and zirconium (but not silicon alone, germanium alone or tantalum alone)), and having a Verdet constant at a wavelength of 1064 nm that is at least 0.14 min/(Oe·cm).

[2] The magneto-optical material of [1] which is characterized in that when laser light having a wavelength of 1064 nm is input thereto at a beam diameter of 1.6 mm, for an optical path length of 10 mm, the maximum input power of laser light which does not generate a thermal lens is 30 W or more.

[3] The magneto-optical material of [1] or [2] which, for an optical path length of 10 mm, has an in-line transmittance of light at a wavelength of 1064 nm that is at least 90%.

[4] The magneto-optical material of any of [1] to [3] which has a main phase comprising a cubic structure having a pyrochlore lattice.

[5] The magneto-optical material of any one of [1] to [4], wherein the transparent ceramic has an average sintered particle diameter of not more than 2.5 μm.

[6] A method of manufacturing a magneto-optical material, comprising the steps of: firing terbium oxide powder and at least one oxide powder selected from the group consisting of silicon oxide, germanium oxide, titanium oxide, tantalum oxide, tin oxide, hafnium oxide and zirconium oxide (but not silicon oxide alone, germanium oxide alone or tantalum oxide alone) in a crucible to produce a fired starting material containing, as a main component, a cubic pyrochlore-type oxide; grinding the fired starting material to form a starting powder; pressing the starting powder to a predetermined shape and then sintering the pressed powder; and subsequently hot isostatic pressing so as to obtain a transparent ceramic sintered body containing as a main component a complex oxide of formula (1) below $$Tb_2R_2O_7 \tag{1}$$

(wherein R is at least one element selected from the group consisting of silicon, germanium, titanium, tantalum, tin, hafnium and zirconium (but not silicon alone, germanium alone or tantalum alone)).

[7] The magneto-optical material manufacturing method of [6] which is characterized in that the firing temperature is at least 1200° C. and lower than the temperature in subsequent sintering.

[8] A magneto-optical device which is constructed using the magneto-optical material of any one of [1] to [5].

[9] The magneto-optical device of [8] which is an optical isolator that comprises the magneto-optical material as a Faraday rotator and a polarizing material at front and back sides of the Faraday rotator on an optical axis thereof, and that can be used in a wavelength range of at least 0.9 μm and 1.1 μm or less.

[10] The magneto-optical device of [9], wherein the Faraday rotator has an antireflective coating on an optical face thereof.

Advantageous Effects of the Invention

According to the invention, there can be provided transparent magneto-optical materials which are suitable for constructing magneto-optical devices such as optical isolators that, even when mounted in a fiber laser system having a wavelength range of 0.9 to 1.1 μm, do not degrade the beam quality, and which have a Verdet constant larger than that of TGG crystals and thus enable miniaturization.

BRIEF DESCRIPTION OF THE DIAGRAMS

EMBODIMENT FOR CARRYING OUT THE INVENTION

Magneto-Optical Material

Figure 1:
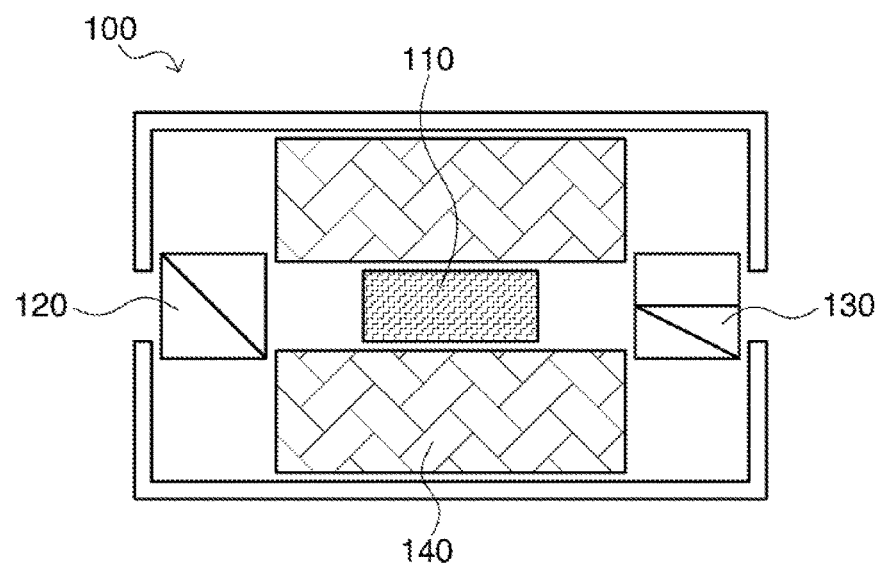
FIG. 1 is a schematic cross-sectional view showing an example of an optical isolator in which the magneto-optical material of the invention is used as a Faraday rotator.

The magneto-optical material of the invention is described below.

The magneto-optical material of the invention is characterized by comprising a transparent ceramic containing as a main component a complex oxide of formula (1) below, or comprising a single crystal of a complex oxide of formula (1) below

$$Tb_2R_2O_7 \tag{1}$$

(wherein R is at least one element selected from the group consisting of silicon, germanium, titanium, tantalum, tin, hafnium and zirconium (but not silicon alone, germanium alone or tantalum alone)), and having a Verdet constant at a wavelength of 1064 nm that is at least 0.14 min/(Oe·cm).

Terbium has, with the exception of iron (Fe), the largest Verdet constant of the paramagnetic elements, and moreover is transparent at a wavelength of 1.06 μm (in-line transmittance of light for an optical path length of 1 mm, ≥80%). It is therefore the element best suited for use in optical isolators in this wavelength region. However, to take full advantage of such transparency, terbium cannot be in a metallically bonded state and must be rendered into the state of a stable compound.

The most typical morphology that forms stable compounds is exemplified by oxides. Of these, because certain types of materials having a pyrochlore-type structure (complex oxides) assume a cubic structure (this being referred to here as a "cubic structure having a pyrochlore lattice (pyrochlore-type cubic structure)," highly transparent compounds that do not cause anisotropic scattering can be obtained. Therefore, compounds which are pyrochlore-type oxides composed of a system having terbium at the A sites and which assume a cubic structure (terbium-containing cubic system pyrochlore-type oxides) are preferred as materials for use in optical isolators at a wavelength range of at least 0.9 μm and 1.1 μm or less, and more specifically 1064±40 nm.

Preferred use can be made of silicon, germanium, titanium, tantalum, tin, hafnium or zirconium as the B-site element for obtaining a cubic structure.

However, because the ionic radii of silicon and germanium are too small, filling the B-sites with these elements alone is undesirable because the crystal structure may become orthorhombic, interfering with the transparency. Hence, when silicon or germanium is selected, this is used in combination with another element having a larger ionic radius—namely, zirconium.

As a result, the magneto-optical material of the invention preferably includes, as a main phase, a cubic structure having a pyrochlore lattice (pyrochlore-type cubic structure), and more preferably consists essentially of a pyrochlore-type cubic structure. Here, to include "as a main phase" means that a pyrochlore-type cubic structure accounts for at least 90 vol %, and preferably at least 95 vol %, of the overall crystal structure. Alternatively, it means that the pyrochlore transformation ratio, as calculated from powder x-ray diffraction results for this magneto-optical material, is at least 51.5% when R in above formula (1) is zirconium alone, and is at least 97.3%, and preferably at least 99%, when R is something else (that is, when R is at least one element selected from the group consisting of silicon, germanium, titanium, tantalum, tin, hafnium and zirconium (but not silicon alone, germanium alone, tantalum alone or zirconium alone)).

The "pyrochlore transformation ratio" is the molar fraction of an ideal pyrochlore-type cubic structure in a target material, as determined from the position at the peak corresponding to the (622) plane of cubic crystals in a powder x-ray diffraction pattern of the target material (the value $P_{(622)}$) by using the 2θ value for the (622) plane of terbium oxide based on Vegard's rule ($P_{Tb}$) and the 2θ value of the (622) plane when the target material is treated as an ideal pyrochlore-type cubic structure ($P_{TbR}$). The (622) plane is the diffraction plane on the widest angle side of the four main diffraction planes in the x-ray diffraction pattern of pyrochlore-type cubic crystals.

The magneto-optical material of the invention has an average sintered particle diameter in the transparent ceramic of preferably not more than 2.5 μm, and more preferably not more than 2.1 μm. At an average sintered particle diameter greater than 2.5 μm, it may not be possible to ensure transparency. Although there is no particular lower limit in the average sintered particle diameter, this is typically 1 μm or more for reasons having to do with production.

Formula (1) includes terbium and R, which is at least one element selected from the group consisting of silicon, germanium, titanium, tantalum, tin, hafnium and zirconium (but is not silicon alone, germanium alone or tantalum alone), and may include also other elements as well. Typical examples of the other elements include rare-earth elements such as lanthanum, gadolinium, thulium, cerium, praseodymium, ytterbium and dysprosium, and various impurities such as calcium, aluminum, phosphorus, tungsten and molybdenum.

The content of such other elements, based on a value of 100 for the total amount of terbium, is preferably not more than 10, more preferably not more than 1, even more preferably not more than 0.1, and most preferably not more than 0.001 (essentially zero).

The magneto-optical material of the invention includes, as a main component, a complex oxide of formula (1) above. That is, so long as the magneto-optical material of the invention includes a complex oxide of formula (1) as the main component, other ingredients may be intentionally included therein as secondary ingredients.

Here, "includes as a main component" means to include at least 50 wt % of the complex oxide of formula (1). The content of the complex oxide of formula (1) is preferably at least 80 wt %, more preferably at least 90 wt %, even more preferably at least 99 wt %, and most preferably at least 99.9 wt %.

Common examples of such secondary ingredients (ingredients other than the main component) include dopants which are added during single crystal growth, fluxes, and sintering aids which are added during ceramic production.

Methods for producing the magneto-optical material of the invention include single crystal production methods such as the floating zone method and micro-pulling-down, and also ceramic production methods. Although any of these methods may be used, generally, in single crystal production, there are certain constraints on design of the concentration ratios in a solid solution. Hence, ceramic production methods are more preferred in this invention.

Ceramic production methods are described in greater detail below as examples of methods for producing the magneto-optical material of the invention, although single crystal production methods in keeping with the technical ideas of this invention are not excluded.

<<Ceramic Production Method>>
[Starting Materials]

Starting materials suitable for use in this invention include powders, or nitric acid, sulfuric acid, uric acid or other aqueous solutions, of the metals serving as constituent elements of the inventive magneto-optical material which is composed of terbium and the element R (R being at least one element selected from the group consisting of silicon, germanium, titanium, tantalum, tin, hafnium and zirconium (but not silicon alone, germanium alone or tantalum alone)). Alternatively, oxide powders of the above elements may be suitably used as the starting materials.

These are weighed out in given amounts to a molar ratio of terbium to R of 1:1, mixed together and fired so as to obtain a fired starting material having as a main component a cubic pyrochlore-type oxide of the desired composition. The firing temperature at this time is preferably at least 1200° C. and lower than the temperature in subsequent sintering, and more preferably at least 1400° C. and lower than the temperature in subsequent sintering. Here, "having as a main component" means that the above-described pyrochlore transformation ratio computed from the powder x-ray diffraction results for the fired starting material is at least 41.5% when R in formula (1) is zirconium alone, and is at least 50%, and preferably at least 55%, when R is something else (that is, when R is at least one element selected from the group consisting of silicon, germanium, titanium, tantalum, tin, hafnium or zirconium (but is not silicon alone, germanium alone, tantalum alone or zirconium alone).

These starting materials have purities of preferably at least 99.9 wt %. Next, the fired starting material thus obtained is ground to form a starting powder.

Ceramic production is ultimately carried out using a pyrochlore-type oxide powder of the desired composition, but the shape of the powder at that time is not particularly limited. For example, suitable use may be made of angular, spherical or lamellar powders. Alternatively, secondary agglomerated powders may be suitably used, or granular powders obtained by granulating treatment such as spray drying may be suitably used. The processes used to prepare such starting powders are not particularly limited. Starting powders produced by co-precipitation, grinding, spray pyrolysis, the sol-gel method, alkoxide hydrolysis and various other methods of synthesis may be suitably used. The resulting starting powders may be suitably treated in, for example, a wet ball mill, bead mill or jet mill, or a dry jet mill or hammer mill.

A suitable sintering inhibitor (sintering aid) may be added to the pyrochlore-type oxide powder starting material used in this invention. To obtain a particularly high transparency, it is preferable to add a sintering inhibitor that is suitable for terbium-containing pyrochlore-type oxides. The purity thereof is preferably at least 99.9 wt %. When a sintering inhibitor is not added, it is desirable to select, as the starting powder to be used, one in which the primary particles are nanosized and which has a very high sintering activity. Such selection may be made as appropriate.

Various types of organic additives are sometimes added for stability of quality and improved yield in the production process. These are not particularly limited in the invention. Preferred use can be made of, for example, various types of dispersants, binders, lubricants and plasticizers.

[Production Process]

In this invention, the starting powder is pressed into a predetermined shape, after which debinding is carried out. The powder is then sintered, thereby producing a sintered body that has been densified to a relative density of not less than 92%. Hot isostatic pressing (HIP) is preferably carried out in a subsequent step.

(Pressing)

An ordinary pressing step may be suitably used in the production method of the invention. That is, a very common pressing step may be used, such as one in which the starting powder is filled into a die and pressure is applied from a fixed direction, or a cold isostatic pressing (CIP) step in which the starting powder is placed and sealed within a deformable waterproof container and hydrostatic pressure is applied. The applied pressure may be suitably adjusted while checking the relative density of the compact obtained and is not particularly limited, although production costs can be held down by controlling the applied pressure within the pressure range of up to about 300 MPa that commercial CIP equipment is capable of handling. Alternatively, suitable use may be made of, for example, a hot pressing step or a spark plasma sintering step which, during forming, not only carries out a forming step but also proceeds without interruption to sintering, or a microwave heating step.

(Debinding)

An ordinary debinding step may be suitably used in the production method of the invention. That is, production may proceed via a debinding step at an elevated temperature within a heating furnace. The type of atmospheric gas used at this time is not particularly limited; for example, suitable use may be made of air, oxygen, hydrogen or the like. The debinding temperature also is not particularly limited, although when using a starting material having organic additives mixed therein, it is preferable to raise the temperature to a level at which the organic ingredients can be decomposed and eliminated.

(Sintering)

An ordinary sintering step may be suitably used in the production method of the invention. That is, a heat sintering step that entails resistance heating, induction heating or the like may be suitably used. The atmosphere at this time is not particularly limited, although suitable use may be made of, for example, inert gas, oxygen, hydrogen or a vacuum. Alternatively, sintering may be carried out under reduced pressure (in a vacuum).

The sintering temperature in the sintering step of the invention is suitably adjusted according to the starting materials selected for use. Generally, it is preferable to choose a temperature which is from several tens of degrees Celsius to about 100° C. to 200° C. lower than the melting point of the terbium-containing pyrochlore-type oxide sintered body to be produced using the starting materials that have been selected. When a terbium-containing pyrochlore-type oxide sintered body is to be produced for which there exists, near the chosen temperature, a temperature region at which a phase change to a phase that is other than cubic occurs, sintering under strict control to ensure that the temperature remains outside of such a temperature region provides the advantage of making it possible to inhibit the admixture of other than cubic phases and to reduce scattering due to birefringence.

The sintering hold time in this sintering step of the invention is suitably adjusted according to the starting materials that are selected. In general, a sintering hold time of about several hours is usually sufficient. However, densification to a relative density in the terbium-containing pyrochlore-type oxide sintered body of not less than 92% is essential.

(Hot Isostatic Pressing (HIP))

In the production method of the invention, after passing through the sintering step, a step in which hot isostatic pressing (HIP) is carried out may be additionally provided.

The pressurizing gas medium used at this time is preferably an inert gas such as argon or nitrogen, or may be Ar—$O_2$. The pressure applied by the pressurizing gas medium is preferably between 50 and 300 MPa, and more preferably between 100 and 300 MPa. At below 50 MPa, a transparency improving effect may not be obtained, whereas increasing the pressure to above 300 MPa does not yield a higher improvement in transparency and places an excessive load on the equipment, which may lead to equipment damage. It is convenient and thus desirable for the applied pressure to be 196 MPa or below, at which pressure treatment can be carried out in a commercial HIP apparatus.

The treatment temperature at this time (specific holding temperature) should be suitably set according to the type of material and/or the sintered state. For example, this may be set in the range of 1000 to 2000° C., and preferably 1300 to 1800° C. As in the sintering step, it is critical for the treatment temperature here to be set no higher than the melting point and/or no higher than the phase transition temperature of the terbium-containing pyrochlore-type oxide making up the sintered body. At a heat treatment temperature above 2000° C., the terbium-containing pyrochlore-type oxide sintered body anticipated in this invention ends up either exceeding the melting point or exceeding the phase transition point, making it difficult to carry out proper HIP treatment. On the other hand, at a heat treatment temperature below 1000° C., a sintered body transparency improving effect is not obtained. The heat treatment temperature holding time, although not particularly limited, should be suitably adjusted while ascertaining the properties of the terbium-containing pyrochlore-type oxide making up the sintered body.

The heater material, heat-insulating material and treatment vessel used to carry out HIP treatment are not particularly limited, although preferred use may be made of graphite or molybdenum (Mo).

(Annealing)

In the manufacturing method of the invention, following the completion of HIP treatment, in some cases, oxygen defects arise in the resulting terbium-containing pyrochlore-type oxide sintered body and the sintered body exhibits a light gray-colored appearance. When this happens, it is preferable to carry out slight-oxidation annealing treatment under conditions similar to the HIP treatment pressure. When doing so, carrying out slight-oxidation annealing using the same equipment as in HIP treatment is desirable in that it simplifies the manufacturing process. By means of such annealing treatment, even those terbium-containing pyrochlore-type oxide sintered bodies which exhibit a light gray-colored appearance can all be rendered into clear, colorless ceramic bodies.

(Optical Polishing)

In the production method of the invention, it is preferable for the terbium-containing pyrochlore-type oxide sintered body (i.e., transparent ceramic) obtained by the above series of production steps to be optically polished at both endfaces on the axis thereof that is to be optically used. The optical surface accuracy at this time, for a measurement wavelength $\lambda=633$ nm, is preferably $\lambda/8$ or below, and more preferably $\lambda/10$ or below. Optical loss may be further reduced by suitably forming an antireflective coating on the optically polished surface.

A magneto-optical material which has a Verdet constant at a wavelength of 1064 nm that is at least 0.14 min/(Oe·cm) can thereby be obtained. The magneto-optical material of the invention preferably has, for an optical path length of 10 mm, an in-line transmittance in light transmission at a wavelength of 1064 nm that is 90% or more. In this invention, "in-line transmittance" refers to the in-line transmittance when the transmission spectrum measured in a blank state, that is, without placing a sample in the measurement light path, is set to 100%. When laser light having a wavelength of 1064 nm is input to the magneto-optical material of the invention over an optical path length of 10 mm and at a beam diameter of 1.6 mm, the maximum input power of laser light that does not generate a thermal lens is preferably 30 W or more, and more preferably 80 W or more. At a thermal lens-free maximum input power below 30 W, use of the inventive magneto-optical material in a high-power fiber laser system may be difficult.

[Magneto-Optical Device]

The magneto-optical material of the invention is suitable for magneto-optical device applications, and is particularly well-suited for use as a Faraday rotator in an optical isolator that operates at wavelengths of between 0.9 and 1.1 μm.

FIG. 1 is a schematic cross-sectional diagram showing an example of an optical isolator which is an optical device that includes, as an optical element, a Faraday rotator made of the magneto-optical material of the invention. In FIG. 1, an optical isolator 100 is provided with a Faraday rotator 110 made of the magneto-optical material of the invention. A polarizer 120 and an analyzer 130, which are polarizing materials, are provided before and after the Faraday rotator 110. In the optical isolator 100, it is preferable for the polarizer 120, the Faraday rotator 110 and the analyzer 130 to be arranged in this order and for a magnet 140 to be mounted on at least one surface of the sidewalls thereof.

This optical isolator 100 can be suitably used in industrial fiber laser systems. That is, it is suitable for preventing laser light that has been emitted by a laser light source and is reflected from returning to the light source and destabilizing oscillation.

EXAMPLES

The invention is illustrated more fully below by way of Working Examples and Comparative Examples, although these Examples are not intended to limit the invention.

Working Example 1, Comparative Example 1

Examples are described here in which hafnium, tin, titanium or zirconium was selected as a single element to fill the B site positions (R in above formula (1)).

Terbium oxide powder produced by Shin-Etsu Chemical Co., Ltd., hafnium oxide powder produced by American Elements, stannic oxide powder and titanium oxide powder produced by Kojundo Chemical Laboratory Co., Ltd., and zirconia powder produced by Nissan Chemical Industries, Ltd. were procured. The purities were all at least 99.9 wt %.

Four pyrochlore-type oxide starting materials, these being $Tb_2Hf_2O_7$, $Tb_2Sn_2O_7$, $Tb_2Ti_2O_7$ and $Tb_2Zr_2O_7$, were produced using the above raw materials. That is, four mixed powders were prepared: a mixed powder obtained by weighing out terbium oxide and hafnium oxide so that the terbium and hafnium are in an equimolar ratio, a mixed powder obtained by weighing out terbium oxide and stannic oxide so that the terbium and tin are in an equimolar ratio, a mixed powder obtained by weighing out terbium oxide and titanium oxide so that the terbium and titanium are in an equimolar ratio, and a mixed powder obtained by weighing out terbium oxide and zirconium oxide so that the terbium and zirconium are in an equimolar ratio. Next, the respective mixed powders were dispersed and mixed in ethanol within a zirconia ball mill while being careful to prevent contamination between the different powders. The treatment time was 24 hours. This was followed by spray-drying treatment, thereby producing granular starting materials, all of which had an average particle size of 20 µm.

Next, these powders were placed in an iridium crucible and fired in a high-temperature muffle furnace at the respective temperatures of 1000° C., 1100° C., 1200° C., 1400° C. and 1600° C. for a holding time of 3 hours, giving fired starting materials of the respective compositions. Each of the resulting fired materials was subjected to diffraction pattern analysis with a powder x-ray diffractometer from PANalytical B.V. That is, in the x-ray diffraction pattern obtained for each fired material, those peaks which correspond to the diffraction peaks of the crystal phases (cubic and orthorhombic) of the pyrochlore-type oxide having that composition were selected, following which the sample was identified from these peaks as having either a cubic or orthorhombic structure. For example, when no sub-peaks from orthorhombic crystals were present in these peaks, and the peaks fit a cubic crystal structure according to Rietveld analysis, the sample was determined to have a cubic structure.

As a result, the first three types of fired materials, when fired at 1200° C. or above, were all confirmed to have a cubic structure thought to be a pyrochlore-type oxide (i.e., respectively $Tb_2Hf_2O_7$, $Tb_2Sn_2O$, $Tb_2Ti_2O_7$) or bixbyite-type oxide crystal phase, or an intermediate transitional phase therebetween. Even the starting material fired at 1100° C. was confirmed to have a cubic structure similar to that when fired at 1200° C. or above. However, the diffraction peak positions were closer to the diffraction peak positions of the bixbyite-type oxide. A clear diffraction pattern for a pyrochlore-type oxide crystal phase was not detected from the starting materials fired at 1000° C.; instead, diffraction patterns for a bixbyite-type oxide crystal phase, and for monoclinic crystals of hafnium oxide or tetragonal crystals of tin oxide and titanium oxide were detected.

The last type of fired material, $Tb_2Zr_2O_7$, when fired at 1200° C. or above, had a cubic pyrochlore-type oxide phase and, intermixed therewith, a cubic bixbyite-type oxide phase. Even in $Tb_2Zr_2O_7$ fired at 1100° C., a similar mixture of cubic crystals was confirmed as when fired at 1200° C. or above. A clear diffraction pattern for a pyrochlore-type oxide crystal phase was not detected in the starting material fired at 1000° C.; instead, diffraction patterns for a bixbyite-type oxide crystal phase and for monoclinic crystals of zirconium oxide were detected.

Next, the pyrochlore transformation ratios for the respective fired materials were determined by the following method.

(Measurement of Pyrochlore Transformation Ratio)

Measurement is explained here for, by way of illustration, a case in which R in the compositional formula (1) is hafnium (Hf).

First, the 2θ angles $P_{Tb}$ and $P_{TbHf}$ for the (622) plane, which is the diffraction plane on the widest angle side of the four main diffraction planes, of terbium oxide ($Tb_4O_7$) and of the pyrochlore-type oxide to be produced, i.e., the ideal cubic pyrochlore-type oxide ($Tb_2Hf_2O_7$), were obtained from literature values. For example, the $P_{Tb}$ value for terbium oxide ($Tb_4O_7$) was obtained from *J. Am. Chem. Soc.*, Vol. 76, p. 5242-5244 (1954), and the $P_{TbHf}$ value for $Tb_2Hf_2O_7$ was obtained from *Solid State Sciences*, Vol. 14, p. 1405-1411 (2012).

Figure 2:
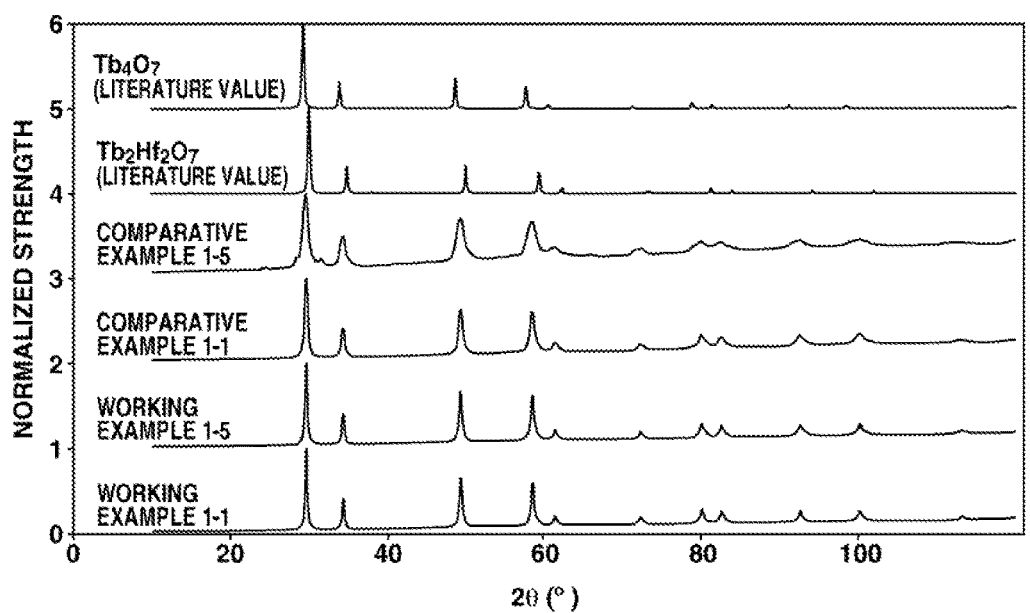
FIG. 2 is a graph of x-ray diffraction patterns for the fired starting powders ($Tb_2Hf_2O_7$) in Working Examples 1-1 and 1-5 and Comparative Examples 1-1 and 1-5.
Figure 3:
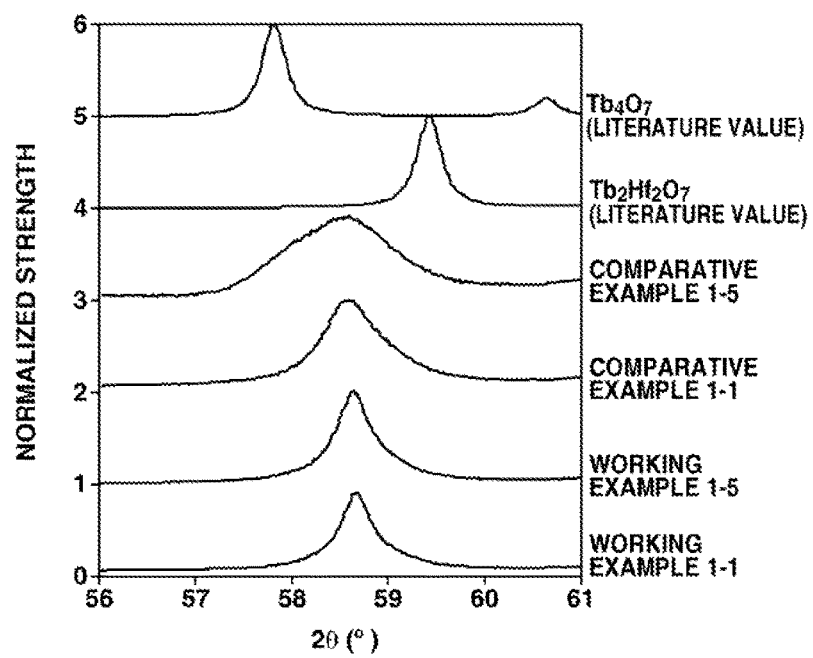
FIG. 3 is an enlarged view of the x-ray diffraction patterns in the vicinity of the (622) plane in FIG. 2.

Next, using a powder x-ray diffractometer from PANalytical B.V., the x-ray diffraction patterns of fired starting powders produced at various firing temperatures (1400° C. (Working Example 1-1), 1200° C. (Working Example 1-5), 1100° C. (Comparative Example 1-1), 1000° C. (Comparative Example 1-5)) were measured by the out-of-plane method (2θ/ω scan method). The x-ray diffractometry conditions were set to: Cu-Kα1, 2 (tube voltage, 45 kV; current, 200 mA); 1 mm×2 mm slit collimation; scanning range, 10° to 110°; step width, 0.02°. FIG. 2 shows the x-ray diffraction patterns of fired starting powders at the respective firing temperatures (Working Examples 1-1 and 1-5, and Comparative Examples 1-1 and 1-5), and the x-ray diffraction patterns from the literature data for terbium oxide ($Tb_4O_7$) and for an ideal cubic pyrochlore-type oxide ($Tb_2Hf_2O_7$). In addition, FIG. 3 shows these x-ray diffraction patterns in the vicinity of the (622) plane.

The 2θ angle data for the (622) plane, which is the diffraction plane on the widest angle side of the four main diffraction planes, is read out for each of the resulting diffraction patterns. The results are shown in Table 1.

It was possible to confirm that the 2θ angle values for the (622) plane of all the starting powders fall in between $P_{Tb}$ for terbium oxide and $P_{TbHf}$ for $Tb_2Hf_2O_7$. Here, assuming that the starting powders obtained by firing are composed of a cubic component that has transformed to pyrochlore and a cubic component similar to terbium oxide that has not transformed to pyrochlore and designating their respective molar fractions as $N_P$ and $(1-N_P)$, based on Vegard's rule (an empirical rule that there exists an approximately proportional relationship between the lattice constant and the molar fraction of a solid solution), the molar fraction $N_P$ was calculated using the following formula (i) and this was defined as the pyrochlore transformation ratio of the fired starting powder.

$$P_{(622)} = N_P P_{TbHf} + (1-N_P) \times P_{Tb} \quad \text{(i)}$$

Here, $P_{(622)}$ is the 2θ angle value (°) for the (622) plane of the starting powder, $P_{TbHf}$ is the 2θ angle value (°) for the (622) plane of the pyrochlore-type $Tb_2Hf_2O_7$, and $P_{Tb}$ is the 2θ angle value (°) for the (622) plane of terbium oxide.

The above results are shown in Table 1.

From Table 1, it was confirmed that, at firing temperatures of 1200° C. and above, the pyrochlore transformation ratio becomes 50% or more, giving a fired material in which the main component is a cubic pyrochlore-type oxide.

TABLE 1

| Composition | | Firing temperature (° C.) | 2θ for (622) plane (°) | Pyrochlore transformation ratio (%) |
|---|---|---|---|---|
| Working Example 1-1 | $Tb_2Hf_2O_7$ | 1,400 | 58.76 | 55.3 |
| Working Example 1-5 | $Tb_2Hf_2O_7$ | 1,200 | 58.63 | 50.1 |
| Comparative Example 1-1 | $Tb_2Hf_2O_7$ | 1,100 | 58.56 | 47.4 |
| Comparative Example 1-5 | $Tb_2Hf_2O_7$ | 1,100 | 58.58 | 40.9 |
| Literature value | $Tb_2Hf_2O_7$ | — | 59.420 | 100 |
| Literature value | $Tb_4O_7$ | — | 57.802* | 0 |

*2θ value for (311) plane. This corresponds to (622) plane of $Tb_2Hf_2O_7$.

In cases where R in the above compositional formula (1) is tin (Sn), as with hafnium above, when the pyrochlore transformation ratio of the fired material was determined for each firing temperature, at firing temperatures of 1200° C. and above, the pyrochlore transformation ratio was 50% or more, thus confirming that these were fired materials in which the main component was a cubic pyrochlore-type oxide (Table 2). The 2θ angle ($P_{TbSn}$) for the (622) plane of $Tb_2Sn_2O_7$ was 58.706° C.

TABLE 2

| | Composition | Firing temperature (° C.) | Pyrochlore transformation ratio (%) |
|---|---|---|---|
| Working Example 1-2 | $Tb_2Sn_2O_7$ | 1,400 | 55.7 |
| Working Example 1-6 | $Tb_2Sn_2O_7$ | 1,200 | 51.3 |
| Comparative Example 1-2 | $Tb_2Sn_2O_7$ | 1,100 | 46.9 |
| Comparative Example 1-6 | $Tb_2Sn_2O_7$ | 1,000 | 40.2 |

In cases where R in the above compositional formula (1) is titanium (Ti), as with hafnium above, when the pyrochlore transformation ratio of the fired material was determined for each firing temperature, at firing temperatures of 1200° C. and above, the pyrochlore transformation ratio was 50% or more, thus confirming that these were fired materials in which the main component was a cubic pyrochlore-type oxide (Table 3). The 2θ angle ($P_{TbTi}$) for the (622) plane of $Tb_2Ti_2O_7$ was 60.561° C.

TABLE 3

| | Composition | Firing temperature (° C.) | Pyrochlore transformation ratio (%) |
|---|---|---|---|
| Working Example 1-3 | $Tb_2Ti_2O_7$ | 1,400 | 55.8 |
| Working Example 1-7 | $Tb_2Ti_2O_7$ | 1,200 | 50.7 |
| Comparative Example 1-3 | $Tb_2Ti_2O_7$ | 1,100 | 48.6 |
| Comparative Example 1-7 | $Tb_2Ti_2O_7$ | 1,000 | 41.3 |

Figure 4:
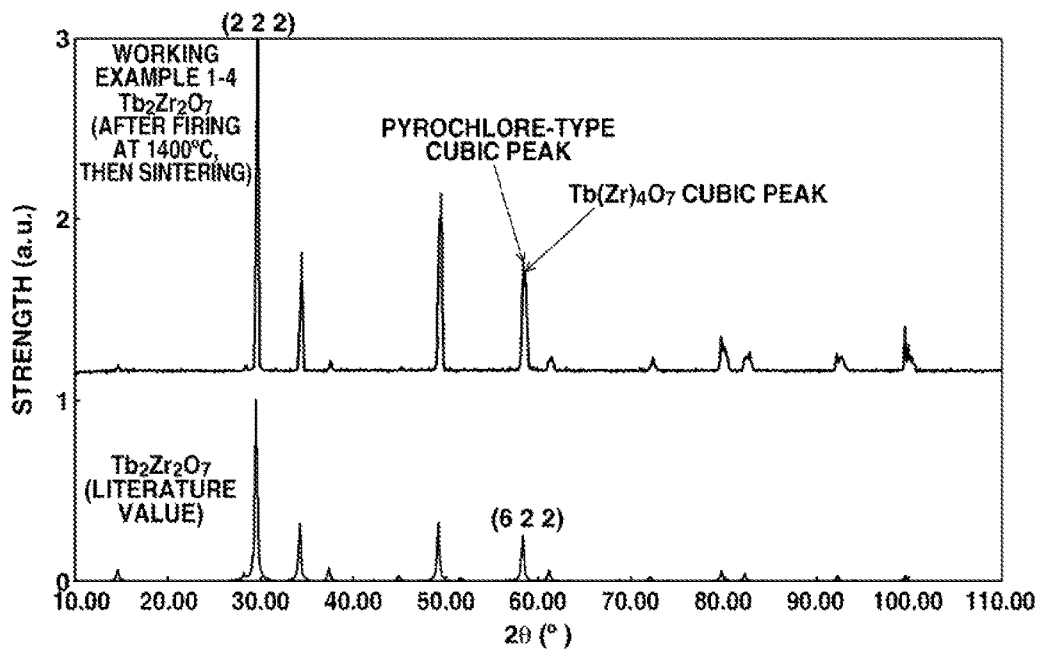
FIG. 4 is a graph of the x-ray diffraction pattern for the sintered body in Working Example 1-4 ($Tb_2Zr_2O_7$).

In cases where R in the above compositional formula (1) is zirconium (Zr), although it was possible to apply the above-described method of computing the pyrochlore transformation ratio to the fired starting powders, the entire peak pattern at the 2θ angle for the (622) plane (near 58.4°) and on the wide angle side above this was found to be continually split. This is a clear mixed crystal peak that can be seen as separate from a double peak on the wide angle side of the Cu-Kα1 and Kα2 lines, and most likely represents Tb(Zr)$_4$O$_{7-\alpha}$ cubic crystals in which Zr ions are in solid solution at Tb sites and which has a slightly smaller lattice constant. Moreover, this Tb(Zr)$_4$O$_{7-\alpha}$ cubic component did not disappear even in the sintered body and continued to remain. An example of this is shown in FIG. 4.

With regard to the pyrochlore transformation ratio of the $Tb_2Zr_2O_7$ fired material, a tentative pyrochlore transformation ratio was calculated using above formula (i), following which the correction factor $K_{(622)}$ in formula (ii) below was calculated based on the peak strength ratio between the pyrochlore-type cubic peak (low angle side) and the Tb(Hf)$_4$O$_{7-\alpha}$ cubic peak (wide angle side) at the 2θ angle for the (622) plane, and this correction factor was multiplied with the tentative pyrochlore transformation ratio to give the pyrochlore transformation ratio. The 2θ angle for the (622) plane of $Tb_2Zr_2O_7$ ($P_{TbZr}$) was set to 58.3830.

$$K_{(622)} = I_{TbZr} / (I_{TbZr} + I_{TbZr}') \quad \text{(ii)}$$

Here, $I_{TbZr}$ is the peak strength (Counts) at the (622) plane of the pyrochlore-type cubic component of the fired material, and $I_{TbZr}'$ is the peak strength (Counts) at the (622) plane of the Tb(Zr)$_4$O$_{7-\alpha}$ cubic component of the fired material.

The results are shown in Table 4.

TABLE 4

| | Composition | Firing temperature (° C.) | Pyrochlore transformation ratio (%) |
|---|---|---|---|
| Working Example 1-4 | $Tb_2Zr_2O_7$ | 1,400 | 48.3 |
| Working Example 1-8 | $Tb_2Zr_2O_7$ | 1,200 | 41.5 |
| Comparative Example 1-4 | $Tb_2Zr_2O_7$ | 1,100 | 34.6 |
| Comparative Example 1-8 | $Tb_2Zr_2O_7$ | 1,000 | 27.7 |

Summarizing the above results, the first three types of starting materials that were fired at 1200° C. or above were all confirmed to be oxide starting materials containing a cubic pyrochlore-type oxide as the main component. $Tb_2Zr_2O_7$ that was fired at 1200° C. or above had a cubic pyrochlore-type oxide phase and, intermixed therewith, a cubic bixbyite-type oxide phase, but was confirmed to be an oxide starting material containing cubic pyrochlore-type oxide as the main component.

Of the starting materials produced in the above verification tests, the starting materials obtained by firing all of the compositions at 1400° C., 1200° C., 1100° C. and 1000° C. (four temperature levels for each of four types of composition) were again dispersed and mixed in ethanol using a zirconia-type ball mill. The treatment time was 40 hours. Spray drying treatment was then carried out again, thereby producing in each case granular pyrochlore-type oxide starting materials having an average particle size of 20 μm.

Each of the resulting starting materials was uniaxially pressed, then isostatically pressed at a pressure of 198 MPa to give a CIP compact. The resulting CIP compact was subjected to 2 hours of debinding treatment at 1000° C. in a muffle furnace. The dried compact was then loaded into a vacuum furnace and treated at 1700° C.±20° C. for 3 hours under a reduced pressure of not more than $2.0 \times 10^{-3}$ Pa, thereby giving a total of 16 types (4 compositions×4 temperature levels) of sintered compacts. During this operation, the sintering temperature was finely adjusted so that the relative density of each sample when sintered becomes 92%.

Each of the resulting sintered compacts was charged into a carbon heater-type HIP furnace and HIP treated in argon at 200 MPa and 1650° C. for 3 hours. A portion of each of the resulting sintered compacts was ground into a powder within a zirconia mortar. Next, each of the resulting powder samples was powder diffraction analyzed with a PANalytical B.V. powder x-ray diffractometer. That is, as in the case of the fired starting materials, those peaks which correspond to the diffraction peaks of the crystal phases (cubic and orthorhombic) of the pyrochlore-type oxide having that composition within the x-ray diffraction pattern obtained for each sintered body were selected, following which the sample was identified from these peaks as having either a cubic or orthorhombic structure. For example, when no sub-peaks from orthorhombic crystals were present in these peaks, and the peaks fit a cubic crystal structure according to Rietveld analysis, the sample was determined to have a cubic structure.

As a result, for the first three types of powder samples that were fired at 1200° C. or above, the crystal phase of the pyrochlore-type oxides (these being, respectively, $Tb_2Hf_2O_7$, $Tb_2Sn_2O_7$ and $Tb_2Ti_2O_7$) were all confirmed to be cubic. With regard to the powder samples that were treated at a firing temperature of 1100° C., the crystal phase of the pyrochlore-type oxide was confirmed to be cubic for all three types. However, the diffraction peak angle shifts somewhat to the low angle side, and so these were presumed to be imperfect pyrochlore-type oxides that are to some degree in a transitional state from a bixbyite-type crystal phase. Diffraction patterns in an intermediate state between the diffraction patterns of bixbyite-type oxide and pyrochlore-type oxide were confirmed from the samples fired at 1000° C. (three types of powder samples), but because of the large disparity with literature values for the (622) planes of $Tb_2Hf_2O_7$, $Tb_2Sn_2O_7$ and $Tb_2Ti_2O_7$, it was difficult to conclude that pyrochlore-type oxide is the main component.

The last powder sample, $Tb_2Zr_2O_7$, when treated at firing temperatures of 1200° C. and above, had a cubic pyrochlore-type oxide phase and, intermixed therewith, a cubic bixbyite-type oxide phase. A diffraction pattern of cubic pyrochlore-type oxide and cubic bixbyite-type oxide was also confirmed from $Tb_2Zr_2O_7$ treated at a firing temperature of 1100° C. However, the peak angle of the (622) plane had shifted to a lower angle side. In powder samples of $Tb_2Zr_2O_7$ treated at a firing temperature of 1000° C., mixed crystals of a cubic bixbyite-type crystal phase and a cubic pyrochlore-type oxide that were even closer to the angles in the diffraction pattern for $Tb_4O_7$ were confirmed.

Next, pyrochlore transformation ratios for sintered bodies having the four types of compositions were determined in the same way as for the respective fired starting materials.

As a result, the first three types of sintered bodies ($Tb_2Hf_2O_7$, $Tb_2Sn_2O_7$ and $Tb_2Ti_2O_7$), when obtained from starting materials treated at firing temperatures of 1200° C. and above, all had pyrochlore transformation ratios of 97.8% or more. In particular, this was 100% in those for which the firing temperature was 1400° C.

As for sintered bodies of $Tb_2Zr_2O_7$, all of those obtained from starting materials treated at firing temperatures of 1200° C. and above had a pyrochlore transformation ratio of 51.5% or more.

The respective ceramic sintered bodies thus obtained were ground and polished to a length of 10 mm, following which both optical endfaces of each sample were given a final optical polish to an optical surface accuracy of λ/8 (when measured at a wavelength λ=633 nm). One piece of each type of sample was collected and used to measure the average sintered particle diameter by scanning electron microscopy (SEM).

(Method of Measuring Average Sintered Particle Diameter)

Using a JSM-7000F scanning electron microscope from JEOL, Ltd., a backscattered electron image of the surface of an optically polished sample was captured at an acceleration voltage of 10 kV in the backscattered electron imaging mode and at a sample tilt angle of 0°. At this time, the brightness and contrast were adjusted so as to obtain a grain boundary contrast for individual sintered grains. Next, in accordance with the method described in *J. Am. Ceram. Soc.*, Vol. 52, No. 8, 443-446 (1969), the average sintered particle diameter was calculated from the SEM image using the following formula.

$$D(\mu m) = 1.56 \times L_{AVE}$$

Here, D is the average sintered particle diameter (μm) and $L_{AVE}$ is the average length (μm) of the particles that lie across an arbitrary straight line, the minimum number of samples used to calculate $L_{AVE}$ being at least 100 and the average of the read-off lengths obtained being treated as the $L_{AVE}$ value.

Next, the optically polished sample was coated with an antireflective coating designed so that the center wavelength becomes 1064 nm. The optical appearance of the sample obtained here was also checked.

As shown in FIG. 1, polarizing elements were set before and after each of the resulting ceramic samples, and the sample was then covered with a magnet. Using a high-power laser (beam diameter, 1.6 mm) manufactured by IPG Photonics Japan, high-power laser light having a wavelength of 1064 nm was input from both endfaces, and the in-line transmittance, Verdet constant and maximum input power that does not generate a thermal lens were measured.

(Method of Measuring in-Line Transmittance)

The in-line transmittance was determined in accordance with JIS K7361 and JIS K7136 by using a light source from NKT Photonics and a power meter and a Ge photodetector from Gentec, and using optics manufactured in-house. The intensity of light transmitted through a sample when 1064 nm wavelength light is applied at a beam diameter of 1 to 3 mm was measured, and the measured value was inserted into the following formula.

In-line transmittance (%/cm)=$I/Io \times 100$

Here, I is the transmitted light intensity (intensity of in-line transmitted light through a sample having a length of 10 mm (1 cm)), and Io is the incident light intensity.

(Method of Measuring Verdet Constant)

The Verdet constant V was determined based on the following formula.

$\theta = V \times H \times L$

Here, θ is the Faraday rotation angle (minutes), V is the Verdet constant, H is the magnitude of the magnetic field (Oe), and L is the length of the Faraday rotator (in this case, 1 cm).

(Method of Measuring Maximum Input Power that does not Generate a Thermal Lens)

The maximum input power that does not generate a thermal lens was determined by outputting light at each input power as 1.6 mm spatial light, and then reading off the maximum input power at which, following insertion of the Faraday rotator, the change in focal distance becomes 0.1 m or less.

The high-power laser that was used had a maximum power of 100 W. Hence, thermal lens evaluation above this power level was not possible.

These results are all presented in Table 5.

excellent transparency, and a maximum thermal lens-free input power lens of at least 30 W.

Working Example 2, Comparative Example 2

Examples are described here in which at least one element selected from the group consisting of silicon, germanium, titanium, tantalum and tin was filled at the B site positions in above formula (1) to give compositions other than the compositions of Working Example 1.

Terbium oxide powder produced by Shin-Etsu Chemical Co., Ltd., silica powder, germanium dioxide powder, titanium oxide powder and stannic oxide powder produced by Kojundo Chemical Laboratory Co., Ltd., and tantalum pentoxide produced by Showa Chemical Industry Co., Ltd. were procured. The purities were all at least 99.9 wt %.

The following complex oxide starting materials were produced using these raw materials: a mixed powder obtained by weighing out terbium oxide, silica and zirconia in such a way that the molar ratio of terbium to silicon to zirconium is 2:1:1, a mixed powder obtained by weighing out terbium oxide, germanium dioxide and zirconia in such a way that the molar ratio of terbium to germanium to zirconium is 2:1:1, a mixed powder obtained by weighing out terbium oxide, titanium oxide and tantalum pentoxide in such a way that the molar ratio of terbium to titanium to tantalum is 2:1:1, a mixed powder obtained by weighing out terbium oxide, stannic oxide and tantalum pentoxide in such

TABLE 5

| | | | Fired starting material | | Sintered body | | | | | |
|---|---|---|---|---|---|---|---|---|---|---|
| | | Composition | Firing temperature (°C.) | Pyrochlore transformation ratio (%) | Pyrochlore transformation ratio (%) | Average sintered particle size D (μm) | Optical appearance | In-line transmittance (%/cm) | Verdet constant (min/Oe·cm) | Maximum thermal lens-free power (W) |
| Working Example | 1-1 | $Tb_2Hf_2O_7$ | 1,400 | 55.3 | 100 | 1.7 | clear and colorless | 99 | 0.17 | ≥100 |
| | 1-2 | $Tb_2Sn_2O_7$ | 1,400 | 55.7 | 100 | 2.1 | clear and colorless | 98 | 0.17 | 90 |
| | 1-3 | $Tb_2Ti_2O_7$ | 1,400 | 55.8 | 100 | 2.1 | clear and colorless | 97 | 0.16 | 80 |
| | 1-4 | $Tb_2Zr_2O_7$ | 1,400 | 48.3 | 51.9 | 1.8 | clear and colorless, some birefringence | 90 | 0.16 | 30 |
| | 1-5 | $Tb_2Hf_2O_7$ | 1,200 | 50.1 | 98.8 | 1.8 | clear and colorless | 97 | 0.16 | 90 |
| | 1-6 | $Tb_2Sn_2O_7$ | 1,200 | 51.3 | 97.8 | 2.3 | clear and colorless | 97 | 0.16 | 70 |
| | 1-7 | $Tb_2Ti_2O_7$ | 1,200 | 50.7 | 98.6 | 2.4 | clear and colorless | 98 | 0.17 | 80 |
| | 1-8 | $Tb_2Zr_2O_7$ | 1,200 | 41.5 | 51.6 | 1.9 | clear and colorless | 90 | 0.16 | 30 |
| Comparative Example | 1-1 | $Tb_2Hf_2O_7$ | 1,100 | 47.4 | 96.3 | 2.7 | white with some loss of clarity | 4 | not measurable | not measurable |
| | 1-2 | $Tb_2Sn_2O_7$ | 1,100 | 46.9 | 95.6 | 2.9 | white with some loss of clarity | 10 | not measurable | not measurable |
| | 1-3 | $Tb_2Ti_2O_7$ | 1,100 | 48.6 | 97.1 | 3.0 | white with some loss of clarity | 5 | not measurable | not measurable |
| | 1-4 | $Tb_2Zr_2O_7$ | 1,100 | 34.6 | 51.3 | 2.7 | white with some loss of clarity | 4 | not measurable | not measurable |
| | 1-5 | $Tb_2Hf_2O_7$ | 1,000 | 40.9 | 94.8 | 4.3 | cloudy with loss of clarity | 0 | not measurable | not measurable |
| | 1-6 | $Tb_2Sn_2O7$ | 1,000 | 40.2 | 93.6 | 5.2 | cloudy with loss of clarity | 0 | not measurable | not measurable |
| | 1-7 | $Tb_2Ti_2O_7$ | 1,000 | 41.3 | 94.9 | 5.1 | cloudy with loss of clarity | 0 | not measurable | not measurable |
| | 1-8 | $Tb_2Zr_2O_7$ | 1,000 | 27.7 | 50.9 | 4.5 | cloudy with loss of clarity | 0 | not measurable | not measurable |

From the above results, it was confirmed that, for all four compositions in Working Examples 1-1 to 1-8, at firing temperatures of 1200° C. and above, a material is obtained which has a pyrochlore-type cubic structure as the main phase, an average sintered particle diameter of not more than 2.4 μm, a Verdet constant of at least 0.16 min/(Oe·cm), an a way that the molar ratio of terbium to tin to tantalum is 2:1:1, a mixed powder obtained by weighing out terbium oxide and silica in such a way that terbium and silicon are in an equimolar ratio, a mixed powder obtained by weighing out terbium oxide and germanium dioxide in such a way that terbium and germanium are in an equimolar ratio, and a mixed powder obtained by weight out terbium oxide and tantalum pentoxide in such a way that terbium and tantalum are in an equimolar ratio. Next, the mixed powders were dispersed and mixed in ethanol within a zirconia ball mill while being careful to prevent contamination between the different powders. The treatment time was 24 hours. This was followed by spray-drying treatment, thereby producing granular starting materials, all of which had an average particle size of 20 µm. These powders were then placed in an iridium crucible and fired in a high-temperature muffle furnace at 1400° C. for 3 hours. Each of the resulting fired starting materials was subjected to diffraction pattern analysis with a powder x-ray diffractometer from PANalytical B.V, and the pyrochlore transformation ratios were determined in the same way as in the case in Working Example 1 where R in formula (1) is hafnium.

Next, each of the resulting starting materials was again dispersed and mixed in ethanol using a zirconia-type ball mill. The treatment time was 40 hours. Spray drying treatment was then carried out again, thereby producing in each case a granular complex oxide starting material having an average particle size of 20 µm.

Each of the resulting starting materials was uniaxially pressed, then isostatically pressed at a pressure of 198 MPa to give a CIP compact. The resulting compact was subjected to 2 hours of debinding treatment at 1000° C. in a muffle pattern of three differing phases. However, accurate identification was not possible. Hence, this is denoted here as $Tb_2Ta_2O_{7+\alpha}$. The pyrochlore transformation rates were determined at the same time.

The respective ceramic sintered bodies thus obtained were ground and polished to a length of 10 mm, following which both optical endfaces of each sample were given a final optical polish to an optical surface accuracy of λ/8 (when measured at a wavelength λ=633 nm), and the average sintered particle diameter D was measured in the same way as in Working Example 1. In addition, the samples were coated with an antireflective coating designed so that the center wavelength becomes 1064 nm. The optical appearances of the samples obtained here were also checked.

As shown in FIG. 1, polarizing elements were set before and after each of the resulting ceramic samples, and the sample was then covered with a magnet. Using a high-power laser (beam diameter, 1.6 mm) manufactured by IPG Photonics Japan, high-power laser light having a wavelength of 1064 nm was input from both endfaces, and the in-line transmittance, Verdet constant and maximum input power that does not generate a thermal lens were measured in the same way as in Working Example 1.

The high-power laser that was used had a maximum power of 100 W. Hence, thermal lens evaluation above this power level was not possible.

These results are shown collectively in Table 6.

TABLE 6

| | | Fired starting material | Sintered body | | | | |
|---|---|---|---|---|---|---|---|
| | Composition | Pyrochlore transformation ratio (%) | Pyrochlore transformation ratio (%) | Average sintered particle size D (µm) | Optical appearance | In-line transmittance (%/cm) | Verdet constant (min/Oe·cm) | Maximum thermal lens-free power (W) |
| Working Example | 2-1 $Tb_2Si_1Zr_1O_7$ | 56.4 | 98.2 | 2.5 | clear and colorless | 96 | 0.16 | 80 |
| | 2-2 $Tb_2Ge_1Zr_1O_7$ | 56.2 | 98.9 | 2.3 | clear and colorless | 96 | 0.16 | 80 |
| | 2-3 $Tb_2Ti_1Ta_1O_7$ | 53.5 | 97.4 | 1.8 | clear and colorless | 94 | 0.15 | 40 |
| | 2-4 $Tb_2Sn_1Ta_1O_7$ | 52.3 | 97.3 | 1.9 | clear and colorless | 94 | 0.14 | 30 |
| Comparative Example | 2-1 $Tb_2Si_2O_7$ | 0 | 0 | 2.8 | white with some loss of clarity | 30 | 0.17 | 5 |
| | 2-2 $Tb_2Ge_2O_7$ | 0 | 0 | 2.6 | white with some loss of clarity | 40 | 0.17 | 5 |
| | 2-3 $Tb_2Ta_2O_{7+\alpha}$ | 55.9 | 84.2 | 3.5 | gray with loss of clarity | 5 | not measurable | not measurable | furnace. The dried compact was then loaded into a vacuum furnace and treated at 1700° C.±20° C. for 3 hours, thereby giving various sintered compacts. During this operation, the sintering temperature was adjusted so that the relative density of each sample when sintered becomes 92%.

Each of the resulting sintered compacts was charged into a carbon heater-type HIP furnace and HIP treated in argon at 200 MPa and 1650° C. for 3 hours. A portion of each of the resulting sintered compacts was ground into a powder within a zirconia mortar. Next, each of the resulting powder samples was powder diffraction analyzed with a PANalytical B.V. powder x-ray diffractometer in the same way as in Working Example 1 (Table 6). As a result, it was possible to confirm that the group of compositions $Tb_2Si_1Zr_1O_7$, $Tb_2Ge_1Zr_1O_7$, $Tb_2Ti_1Ta_1O_7$ and $Tb_2Sn_1Ta_1O_7$ were cubic pyrochlore-type oxides. The group of compositions $Tb_2Si_2O_7$ and $Tb_2Ge_2O_7$ were of a pyrochlore-type but the crystal system was orthorhombic. Finally, a distinct pyrochlore-type diffraction pattern was not obtained for $Tb_2Ta_2O_7$; the results obtained appeared to be a mixed From the above results, it was confirmed that elements which, when used alone to fill the B sites, lead to a total or partial loss of clarity, the occurrence of birefringence even if clear and colorless, or a thermal lens-free maximum input power of 10 W or less (these elements being silicon, germanium and tantalum in Comparative Examples 2-1 to 2-3), on being formed into compositions wherein those elements are in solid solution at the B sites together with a suitable third element (Working Examples 2-1 to 2-4), yield materials having a pyrochlore-type cubic structure as the main phase, an average sintered particle diameter of not more than 2.5 µm, a Verdet constant of at least 0.14 min/(Oe·cm), an excellent transparency, and a thermal lens-free maximum input power of 30 W or more.

Working Example 3

Other examples are described in which hafnium or zirconium was selected for the B-site positions in formula (1).

Terbium oxide powder produced by Shin-Etsu Chemical Co., Ltd., hafnium oxide powder produced by American Elements, and zirconia powder produced by Nissan Chemical Industries, Ltd. were procured. The purities were all at least 99.9 wt %.

The two pyrochlore-type oxide starting materials $Tb_2Hf_2O_7$ and $Tb_2Zr_2O_7$ were produced using these raw materials. That is, the two following mixed powders were prepared: a mixed powder obtained by weighing out terbium oxide and hafnium oxide in such a way that the terbium and hafnium are in an equimolar ratio, and a mixed powder obtained by weighing out terbium oxide and zirconium oxide in such a way that the terbium and zirconium are in an equimolar ratio. Next, the mixed powders were dispersed and mixed in ethanol within a zirconia ball mill while being careful to prevent contamination between the different powders. The treatment time was 24 hours. This was followed by spray-drying treatment, thereby producing granular starting materials, both of which had an average particle size of 20 μm. Next, these powders were placed in an iridium crucible and fired in a high-temperature muffle furnace at 1400° C. for 3 hours. Each of the resulting fired materials was subjected to diffraction pattern analysis with a powder x-ray diffractometer from PANalytical B.V, and the pyrochlore transformation ratios were determined in the same way as in the case in Working Example 1 where R in formula (1) is hafnium.

Next, each of the resulting starting materials was again dispersed and mixed in ethanol using a zirconia-type ball mill. The treatment time was 40 hours. Spray drying treatment was then carried out again, thereby producing in each case a granular complex oxide starting material having an average particle size of 20 μm.

Each of the resulting starting materials was uniaxially pressed, then isostatically pressed at a pressure of 198 MPa to give a CIP compact. The resulting compact was subjected to 2 hours of debinding treatment at 1000° C. in a muffle furnace. The dried compact was then loaded into an oxygen atmosphere furnace or a hydrogen atmosphere furnace and treated at 1700° C.±20° C. for 3 hours while passing through, respectively, oxygen gas or hydrogen gas at a flow rate of 2 L/min and under normal pressure, thereby giving various sintered compacts. During this operation, the sintering temperature was adjusted so that the relative density of each sample when sintered becomes 92%.

Each of the resulting sintered compacts was charged into a carbon heater-type HIP furnace and HIP treated in argon at 200 MPa and 1650° C. for 3 hours. A portion of each of the resulting sintered compacts was ground into a powder within a zirconia mortar. Next, each of the resulting powder samples was powder diffraction analyzed with a PANalytical B.V. powder x-ray diffractometer in the same way as in Working Example 1 (Table 7). As a result, it was possible to confirm that both samples were cubic pyrochlore-type oxides. The pyrochlore transformation rates were determined at the same time.

The respective ceramic sintered bodies thus obtained were ground and polished to a length of 10 mm, following which both optical endfaces of each sample were given a final optical polish to an optical surface accuracy of λ/8 (when measured at a wavelength λ=633 nm), and the average sintered particle diameter D was measured in the same way as in Working Example 1. In addition, the samples were coated with an antireflective coating designed so that the center wavelength becomes 1064 nm. The optical appearances of the samples obtained here were also checked.

As shown in FIG. 1, polarizing elements were set before and after each of the resulting ceramic samples, and the sample was then covered with a magnet. Using a high-power laser (beam diameter, 1.6 mm) manufactured by IPG Photonics Japan, high-power laser light having a wavelength of 1064 nm was input from both endfaces, and the in-line transmittance, Verdet constant and maximum input power that does not generate a thermal lens were measured in the same way as in Working Example 1.

The high-power laser used had a maximum power of 100 W. Hence, thermal lens evaluation above this power level was not possible.

These results are shown collectively in Table 7.

TABLE 7

| | | Composition | Fired starting material | | Sintered body | | | | |
|---|---|---|---|---|---|---|---|---|---|
| | | | Firing atmosphere | Pyrochlore transformation ratio (%) | Pyrochlore transformation ratio (%) | Average sintered particle size D (μm) | Optical appearance | In-line transmittance (%/cm) | Verdet constant (min/Oe · cm) | Maximum thermal lens-free power (W) |
| Working Example | 3-1 | $Tb_2Hf_2O_7$ | oxygen atmosphere | 56.7 | 100 | 1.9 | clear and colorless | 99 | 0.16 | ≥100 |
| | 3-2 | $Tb_2Hf_2O_7$ | hydrogen atmosphere | 55.5 | 98.7 | 1.9 | clear and colorless | 98 | 0.16 | 90 |
| | 3-3 | $Tb_2Zr_2O_7$ | oxygen atmosphere | 50.6 | 51.8 | 2.0 | clear and colorless | 91 | 0.16 | 30 |
| | 3-4 | $Tb_2Zr_2O_7$ | hydrogen atmosphere | 50.5 | 51.6 | 2.1 | clear and colorless | 90 | 0.16 | 30 |

From the above results, even when sintering treatment was carried out in specific gas atmospheres, thus differing from a vacuum sintering method, materials having a pyrochlore-type cubic structure as the main phase were obtained. It was thus confirmed to be possible to manufacture magneto-optical materials having an average sintered particle diameter of 2.1 μm or less, a maximum thermal lens-free input power of 30 W or more, a Verdet constant of at least 0.16 min/(Oe·cm), and excellent transparency.

Although some embodiments of the present invention have been described above for illustrative purposes, those skilled in the art will appreciate that various modifications such as other embodiments, additions and substitutions are possible, insofar as the operation and advantageous effects of the invention are exhibited in all such variations, without departing from the scope and spirit of the invention as disclosed in the accompanying claims.

REFERENCE SIGNS LIST

100 Optical isolator
110 Faraday rotator
120 Polarizer
130 Analyzer
140 Magnet

The invention claimed is:

1. A magneto-optical material comprising a transparent ceramic containing as a main component a complex oxide of formula (1) below, $$Tb_2R_2O_7 \tag{1}$$

(wherein R is at least one element selected from the group consisting of silicon, germanium, tantalum, hafnium and zirconium (but not silicon alone, germanium alone or tantalum alone)),
wherein the transparent ceramic has an average sintered grain diameter of not more than 2.5 μm,
including, as a main phase, a cubic structure having a pyrochlore lattice, wherein the pyrochlore transformation ratio, as calculated from powder x-ray diffraction results for the magneto-optical material, is at least 51.5% when R in above formula (1) is zirconium alone, and at least 97.3% when R is other than zirconium alone, and having a Verdet constant at a wavelength of 1064 nm that is at least 0.14 min/(Oe·cm),
wherein the transparent ceramic, for an optical path length of 10 mm, has at least 90% of in-line transmittance of light at a wavelength of 1064 nm.

2. The magneto-optical material of claim 1, wherein when laser light having a wavelength of 1064 nm is input thereto at a beam diameter of 1.6 mm, for an optical path length of 10 mm, the maximum input power of laser light which does not generate a thermal lens is 30 W or more.

3. A method of manufacturing a magneto-optical material of claim 1, comprising the steps of:
firing terbium oxide powder and at least one oxide powder selected from the group consisting of silicon oxide, germanium oxide, tantalum oxide, hafnium oxide and zirconium oxide (but not silicon oxide alone, germanium oxide alone or tantalum oxide alone) in a crucible to produce a fired starting material containing, as a main component, a cubic pyrochlore-type oxide in which the pyrochlore transformation ratio, computed from the powder x-ray diffraction results for the fired starting material, is at least 41.5% when R in formula (1) is zirconium alone and at least 50% when R is other than zirconium alone;
grinding the fired starting material to form a starting powder;
pressing the starting powder to a predetermined shape and then sintering the pressed powder; and
subsequently hot isostatic pressing so as to obtain a transparent ceramic sintered body containing as a main component a complex oxide of formula (1) below $$Tb_2R_2O_7 \tag{1}$$

(wherein R is at least one element selected from the group consisting of silicon, germanium, tantalum, hafnium and zirconium (but not silicon alone, germanium alone or tantalum alone)).

4. The magneto-optical material manufacturing method of claim 3, wherein the firing temperature is at least 1200° C. and lower than the temperature in subsequent sintering.

5. A magneto-optical device which is constructed using the magneto-optical material of claim 1.

6. The magneto-optical device of claim 5 which is an optical isolator that comprises the magneto-optical material as a Faraday rotator and a polarizing material at front and back sides of the Faraday rotator on an optical axis thereof, and that can be used in a wavelength range of at least 0.9 μm and 1.1 μm or less.

7. The magneto-optical device of claim 6, wherein the Faraday rotator has an antireflective coating on an optical face thereof.

8. A magneto-optical device which is constructed using the magneto-optical material of claim 2.

9. The magneto-optical material of claim 1, wherein the transparent ceramic has an average sintered grain diameter of not more than 2.1 μm.

10. The magneto-optical material of claim 1, wherein R is hafnium or zirconium.

11. The magneto-optical material manufacturing method of claim 3, wherein the firing temperature is at least 1400° C. and lower than the temperature in subsequent sintering.

12. The magneto-optical material manufacturing method of claim 3, wherein the pyrochlore transformation ratio for the fired starting material is at least 55% when R is other than zirconium alone.

* * * * *